United States Patent
Holland et al.

(10) Patent No.: US 9,312,344 B2
(45) Date of Patent: Apr. 12, 2016

(54) METHODS FOR FORMING SEMICONDUCTOR MATERIALS IN STI TRENCHES

(71) Applicant: Taiwan Semiconductor Manufacturing Company, Ltd., Hsin-Chu (TW)

(72) Inventors: Martin Christopher Holland, Leuven (BE); Georgios Vellianitis, Heverlee (BE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/895,134

(22) Filed: May 15, 2013

(65) Prior Publication Data

US 2014/0273398 A1    Sep. 18, 2014

Related U.S. Application Data

(60) Provisional application No. 61/780,068, filed on Mar. 13, 2013.

(51) Int. Cl.
*H01L 21/322* (2006.01)
*H01L 21/302* (2006.01)
(Continued)

(52) U.S. Cl.
CPC ........ *H01L 29/267* (2013.01); *H01L 21/02043* (2013.01); *H01L 21/0243* (2013.01); *H01L 21/0262* (2013.01); *H01L 21/02063* (2013.01); *H01L 21/02378* (2013.01); *H01L 21/02381* (2013.01); *H01L 21/02538* (2013.01); *H01L 21/311* (2013.01); *H01L 21/76* (2013.01); *H01L 21/76224* (2013.01); *H01L 27/1211* (2013.01); *H01L 29/045* (2013.01); *H01L 29/0649* (2013.01); *H01L 29/205* (2013.01); *H01L 29/66462* (2013.01); *H01L 29/66795* (2013.01); *H01L 29/775* (2013.01); *H01L 29/7781* (2013.01); *H01L 21/02639* (2013.01)

(58) Field of Classification Search
CPC ..................... H01L 21/02043; H01L 21/2015; H01L 21/76275; H01L 21/845; H01L 27/1211; H01L 29/045; H01L 29/785; H01L 29/78696
See application file for complete search history.

(56) References Cited

U.S. PATENT DOCUMENTS 8,497,177 B1 * 7/2013 Chang et al. ................... 438/283
2009/0236693 A1 * 9/2009 Moustakas et al. ........... 257/615
(Continued)

FOREIGN PATENT DOCUMENTS

KR    20110038578    4/2011
KR    20110065326    6/2011

OTHER PUBLICATIONS

Kawabe, Mitsuo et al., "Self-Annihilation of Antiphase Boundary in GaAs on Si(100) Grown by Molecular Beam Epitaxy," Japanese Journal of Applied Physics, vol. 26, No. 6, Jun. 1987, pp. L944-L946.
(Continued)

*Primary Examiner* — Pamela E Perkins
(74) *Attorney, Agent, or Firm* — Slater & Matsil, L.L.P.

(57) ABSTRACT

A method includes annealing a silicon region in an environment including hydrogen ($H_2$) and hydrogen chloride (HCl) as process gases. After the step of annealing, a semiconductor region is grown from a surface of the silicon region.

19 Claims, 7 Drawing Sheets

(51) Int. Cl.

| | |
|---|---|
| *H01L 29/267* | (2006.01) |
| *H01L 21/76* | (2006.01) |
| *H01L 21/02* | (2006.01) |
| *H01L 27/12* | (2006.01) |
| *H01L 29/04* | (2006.01) |
| *H01L 21/311* | (2006.01) |
| *H01L 29/06* | (2006.01) |
| *H01L 29/66* | (2006.01) |
| *H01L 21/762* | (2006.01) |
| *H01L 29/775* | (2006.01) |
| *H01L 29/778* | (2006.01) |
| *H01L 29/205* | (2006.01) |

(56) References Cited

U.S. PATENT DOCUMENTS

| | | |
|---|---|---|
| 2011/0086491 A1 | 4/2011 | Ko et al. |
| 2011/0133292 A1 | 6/2011 | Lee et al. |
| 2012/0012935 A1* | 1/2012 | Kaneko et al. ................ 257/351 |
| 2014/0209974 A1* | 7/2014 | Chen ................ H01L 21/02658 257/183 |

OTHER PUBLICATIONS

Matthews, J.W. et al., "Defects in Epitaxial Multilayers," Journal of Crystal Growth, Mar. 27, 1974, North-Holland Publishsing Co., pp. 118-125.

Kitahara, Kuninori et al,. "Observation of Atomic Structure by Scanning Tunneling Microscopy of Vicinal Si(100) Surface Annealed in Hydrogen Gas," Japanese Journal of Applied Physics, vol. 33, Part 2, No. 11B, Nov. 15, 1994, pp. L1571-L1573.

Van Dal, M.J.H. et al., "Demonstration of scaled Ge p-channel FinFETs integrated on Si," IEEE, Electron Devices Meeting (IEDM), Dec. 10-13, 2012, pp. 23.5.1-23.5.4.

Heyns, M. et al., "Advancing CMOS beyond the Si roadmap with Ge and III/V devices," IEEE, Electron Devices Meeting (IEDM), Dec. 5-7, 2011, pp. 13.1.1-13.1.4.

Radosavljevic, G. et al., "Electrostatics Improvement in 3-D Tri-gate Over Ultra-Thin Body Planar InGaAs Quantum Well Field Effect Transistors with High-K Gate Dielectric and Scaled Gate-to-Drain/Gate-to-Source Separation," IEEE, Electron Devices Meeting (IEDM), Dec. 5-7, 2011, pp. 33.1.1-33.1.4.

Radosavljevic, M et al., "Non-Planar, Multi-Gate InGaAs Quantum Well Field Effect Transistors with High-K Gate Dielectric and Ultra-Scaled Gate-to-Drain/Gate-to-Source Separation in Low Power Logic Applications," IEEE, Electron Devices Meeting (IEDM), Dec. 6-8, 2010, pp. 6.1.1-6.1.4.

* cited by examiner

METHODS FOR FORMING SEMICONDUCTOR MATERIALS IN STI TRENCHES

This application claims the priority of the following provisionally filed U.S. patent application: Application Ser. No. 61/780,068, filed Mar. 13, 2013, and entitled "Methods for Forming Semiconductor Materials in STI Trenches," which application is hereby incorporated herein by reference.

BACKGROUND

The speed of Metal-Oxide-Semiconductor (MOS) transistors is closely related to the drive currents of the MOS transistors, which drive currents are further closely related to the mobility of charges. For example, NMOS transistors have high drive currents when the electron mobility in their channel regions is high, while PMOS transistors have high drive currents when the hole mobility in their channel regions is high.

Compound semiconductor materials of group III and group V elements (known as III-V compound semiconductors) are good candidates for forming transistors due to their high electron mobility. Therefore, transistors formed on III-V compound semiconductors have been explored. III-V compound semiconductor films, however, need to be grown on other substrates because it is difficult to obtain bulk III-V crystals. The growth of III-V compound semiconductor films on dissimilar substrates faces difficulties because these substrates have lattice constants and thermal expansion coefficients different than that of the III-V compound semiconductors. Various methods have been used to form high-quality III-V compound semiconductors that do not suffer from severe defects. For example, III-V compound semiconductors were grown from trenches between shallow trench isolation regions to reduce the number of threading dislocations.

The formation of III-V compound semiconductors from trenches typically includes an epitaxy growth, followed by a Chemical Mechanical Polish (CMP) to remove excess III-V compound semiconductors over the shallow trench isolation regions. By forming the III-V compound semiconductors, some defects may be eliminated. The eliminated defects, however are the defects that are not vertically grown. Hence, with the growth of the III-V compound semiconductors, the defects are also grown, and hence extend to, and are blocked by, the sidewalls of the STI regions. These defects include stacking faults and threading dislocations. Other types of defects such as anti-phase domain defects, however, may grow vertically, and hence will not be blocked by shallow trench isolation regions. These defects hence cannot be eliminated by the re-growth process. Anti-phase domain defects are the defects that occur when a compound semiconductor is grown. If a single-element semiconductor such as silicon or germanium is grown, then the anti-phase domain defects will not occur.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A method for growing semiconductor regions from trenches is provided in accordance with exemplary embodiments. The intermediate stages of growing the semiconductor regions in accordance with exemplary embodiments are illustrated. Throughout the various views and illustrative embodiments, like reference numbers are used to designate like elements.

Figure 1:
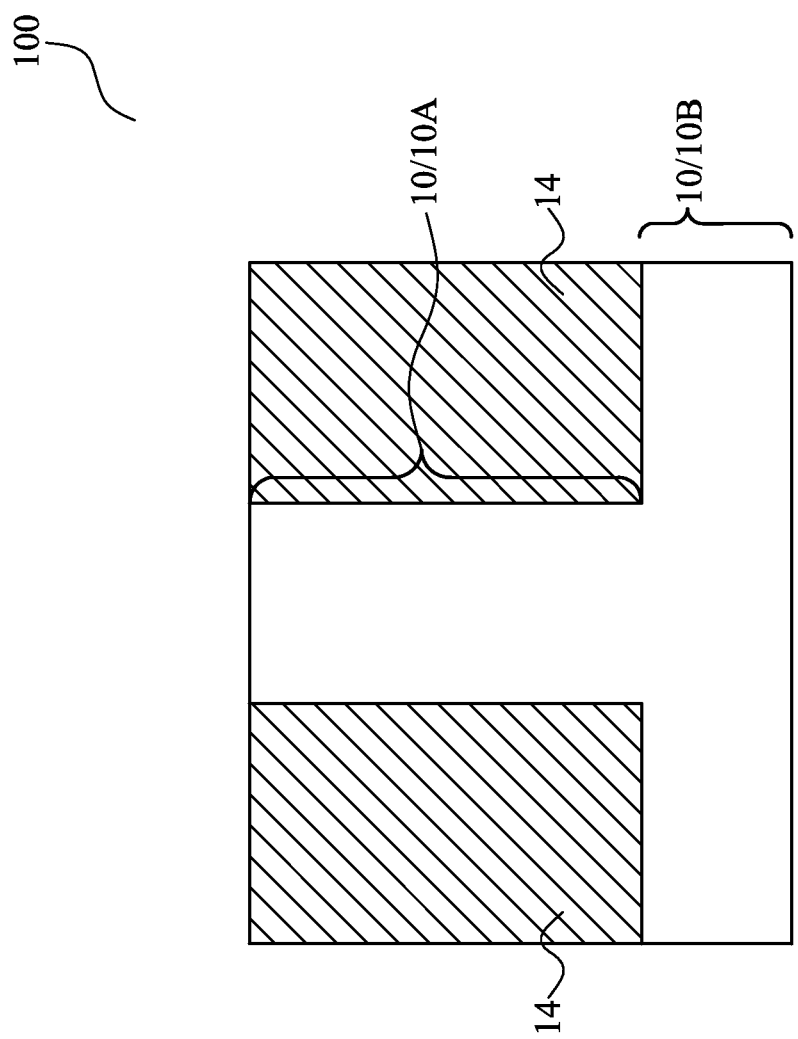
FIGS. 1 through 5 are cross-sectional views of intermediate stages in the formation of a semiconductor fin and a Fin Field-Effect Transistor (FinFET) in accordance with some exemplary embodiments.

FIGS. 1 through 5 illustrate the cross-sectional views of intermediate stages in the formation of a semiconductor fin and a Fin Field-Effect Transistor (FinFET) in accordance with exemplary embodiments. Referring to FIG. 1, substrate 10, which is a part of semiconductor wafer 100, is provided. Substrate 10 may be a single-crystalline silicon substrate. Alternatively, substrate 10 is formed of other materials such as SiC. Isolation regions such as Shallow Trench Isolation (STI) regions 14 are formed in substrate 10. Substrate 10 thus includes region 10A between STI regions 14, and region 10B under STI regions 14. The formation process of STI regions 14 may include etching substrate 10 to form recesses (occupied by STI regions 14), filling the recesses with a dielectric material(s), and performing a planarization to remove excess dielectric materials. The remaining portions of the dielectric material(s) form STI regions 14. In some embodiments, STI regions 14 comprise silicon oxide.

Figure 2:
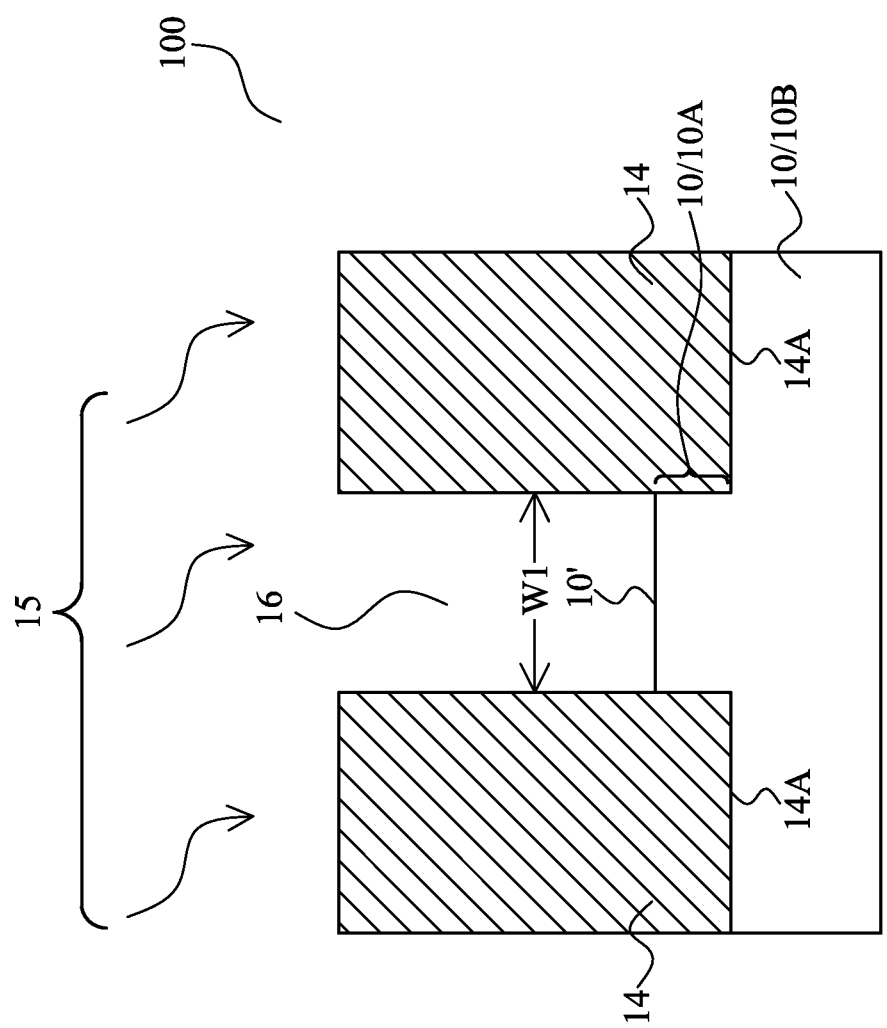

Next, as shown in FIG. 2, region 10A of substrate 10, which region 10A is between opposite sidewalls of STI regions 14, is etched to form trench 16. In some embodiments, top surface 10' of substrate 10, which top surface 10' is exposed to trench 16, is substantially level with bottom surfaces 14A of STI regions 14. In alternative embodiments, top surface 10' of substrate portion 10A is higher than or lower than bottom surfaces 14A of STI regions 14. The etching may be performed using dry etch, with the etching gas selected from $CF_4$, $Cl_2$, $NF_3$, $SF_6$, and combinations thereof. In alternative embodiments, the etching may be performed using wet etching, for example, using Tetra-Methyl Ammonium Hydroxide (TMAH), a potassium hydroxide (KOH) solution, or the like, as an etchant. In the resulting structure, trench 16 may have width W1 smaller than about 150 nm. Width W1 may also be between about 10 nm and about 100 nm. It is appreciated, however, that the values recited throughout the description are merely examples, and may be changed to different values.

Next, as also shown in FIG. 2, an annealing process is performed, as represented by arrows 15. In some embodiments, the annealing is performed with wafer 100 being at a temperature lower than about 870° C. Advantageously, by using the annealing temperature below than about 870° C., wafer 100 will not bow (with significant warpage) after annealing. If, however, a temperature higher than 870° C. is used, wafer 100 may bow after annealing, and hence causing significant process difficulty for the subsequent integrated circuit formation process. The annealing temperature of substrate 10 may also be higher than about 400° C., and lower than about 800° C., or lower than about 750° C. In some exemplary embodiments, the annealing temperature is between about 700° C. and about 725° C. The annealing may be performed for a period of time between about 1 minute and about 10 minutes, although a longer or a short time period may be used.

In some embodiments, the annealing is performed in a process chamber (not shown), with a process gas introduced into the chamber during the annealing. The process gas comprises hydrogen ($H_2$) and hydrogen chloride (HCl) in some embodiments. During the annealing, the flow rate of $H_2$ may be higher than the flow rate of HCl. For example, the flow rate of $H_2$ may be between about 500 sccm and about 20,000 sccm. The flow rate of HCl may be between about 5 sccm and about 200 sccm. Annealing silicon in $H_2$ may cause the migration of silicon atoms at the top surface of silicon region 10A to form double steps, which are shown in detail in FIG. 6. In addition, the introduction of HCl during the annealing further promotes the migration of silicon atoms, so that the formation of double steps may be achieved at the low temperatures of the present disclosure, rather than higher temperatures higher than 870° C. Accordingly, as a result of the annealing, top surface 10' of silicon region 10A is converted from a single-step surface to a double-step surface, and hence the amount of anti-phase domain defects in the subsequent formed epitaxy region 18 (FIG. 3) may be substantially eliminated, or at least reduced.

Figure 3:
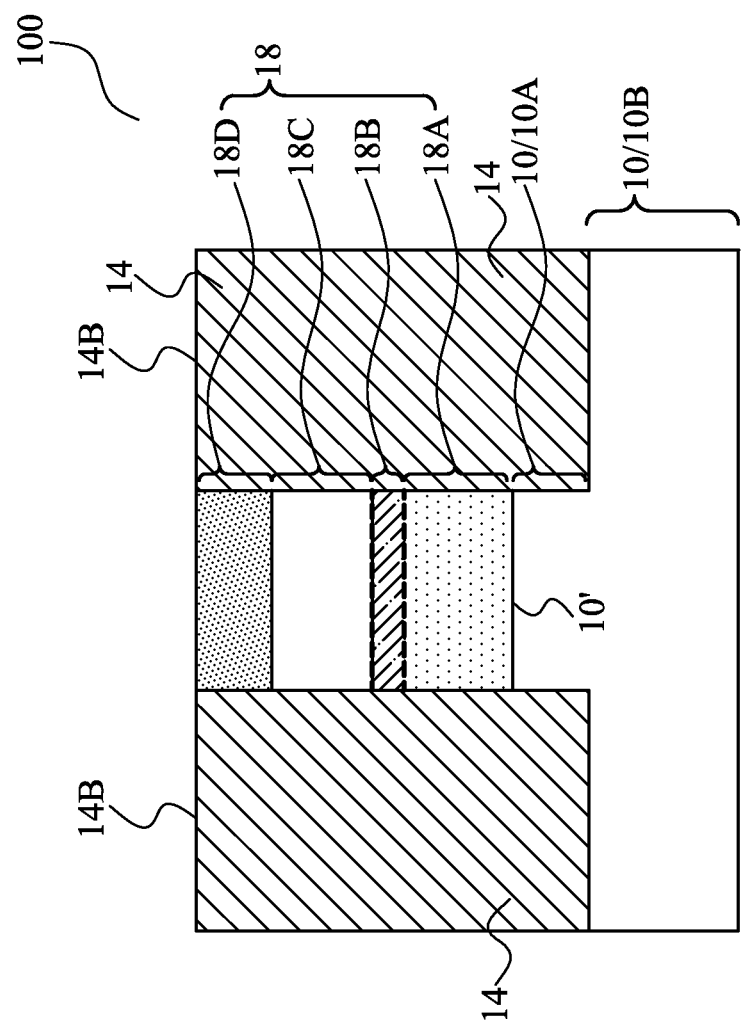

FIG. 3 illustrates the epitaxy of semiconductor region 18. The epitaxy may be performed in situ with the annealing, wherein the epitaxy and the annealing are performed in the same process chamber, although different process chambers may be used. Semiconductor region 18 is epitaxially grown from the exposed top surface 10'. In some embodiments, semiconductor region 18 comprises a III-V compound semiconductor material, which may be a binary or ternary III-V compound semiconductor material. The exemplary III-V compound semiconductor material for forming semiconductor region 18 may be selected from InAs, AlAs, GaAs, InP, GaN, InGaAs, InAlAs, GaSb, AlSb, AlP, GaP, and combinations thereof. Semiconductor region 18 may be a homogenous region, with the entirety of semiconductor region 18 formed of a same material, which may be selected from the above-listed III-V compound semiconductor materials. Semiconductor region 18 may also be a composite region, with a plurality of stacked layers comprising different materials and/or having different compositions. For example, the upper portions of semiconductor region 18 may have greater lattice mismatch with substrate 10 than the lower portions. In some embodiments, semiconductor region 18 comprises InAs region 18A, $Al_2O_3$ region 18B over InAs region 18A, InP region 18C over $Al_2O_3$ region 18B, and InAs region 18D over InP region 18C. In alternative embodiments, the formation of $Al_2O_3$ region 18B is skipped, and the respective semiconductor region 18 comprises InAs region 18A, InP region 18C over InAs region 18A, and InAs region 18D over InP region 18C.

The epitaxy may be continued until the top surface of semiconductor region 18 is higher than top surfaces 14B of STI regions 14. A planarization is then performed. The planarization may comprise a Chemical Mechanical Polish (CMP). The planarization is continued until no semiconductor region 18 is left overlapping STI regions 14. The portion of semiconductor region 18 between STI regions 14, however, remains after the planarization, and is referred to as semiconductor strip 18 hereinafter. In alternative embodiments, the epitaxy is stopped when the top surface of semiconductor region 18 is level with, or lower than, top surfaces 14B of STI regions 14. In these embodiments, the planarization step may be skipped, or may be performed.

Figure 4:
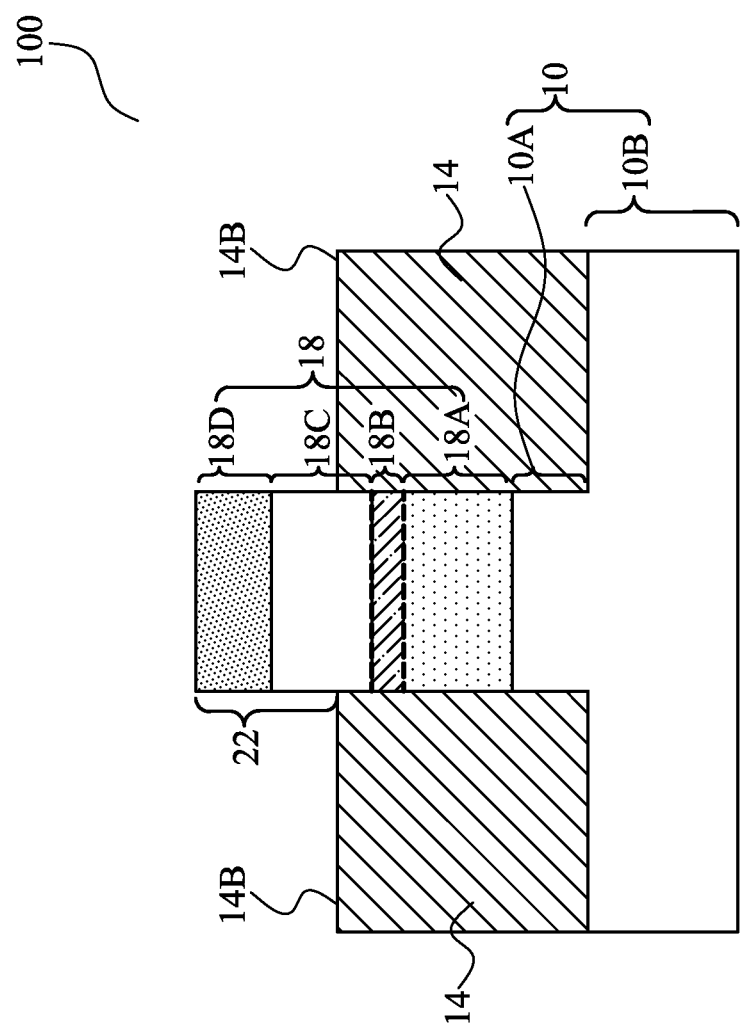

Referring to FIG. 4, STI regions 14 are recessed, for example, through an etching step. A portion of semiconductor strip 18 is thus higher than top surfaces 14B of STI regions 14. This portion of semiconductor strip 18 forms semiconductor fin 22, which may be used to form FinFET 24, as shown in FIG. 5.

Figure 5:
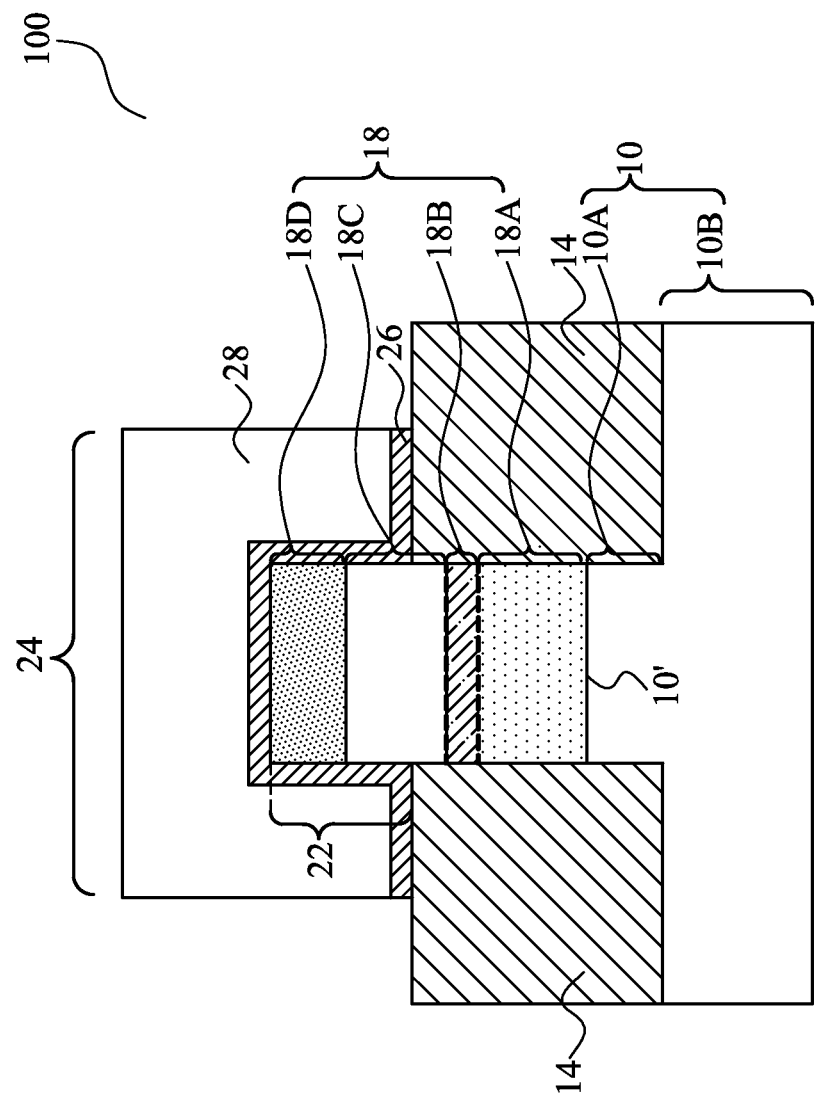

Referring to FIG. 5, gate dielectric 26 and gate electrode 28 are formed. Gate dielectric 26 may be formed of a dielectric material such as silicon oxide, silicon nitride, an oxynitride, multi-layers thereof, and combinations thereof. Gate dielectric 26 may also comprise high-k dielectric materials. The exemplary high-k materials may have k values greater than about 4.0, or greater than about 7.0. Gate electrode 28 may be formed of doped polysilicon, metals, metal nitrides, metal silicides, and the like. The bottom ends of gate dielectric 26 may contact the top surface of STI regions 14. After the formation of gate dielectric 26 and gate electrode 28, source and drain regions (not in the illustrated plane) may be formed to finish the formation of FinFET 24.

Figure 6:
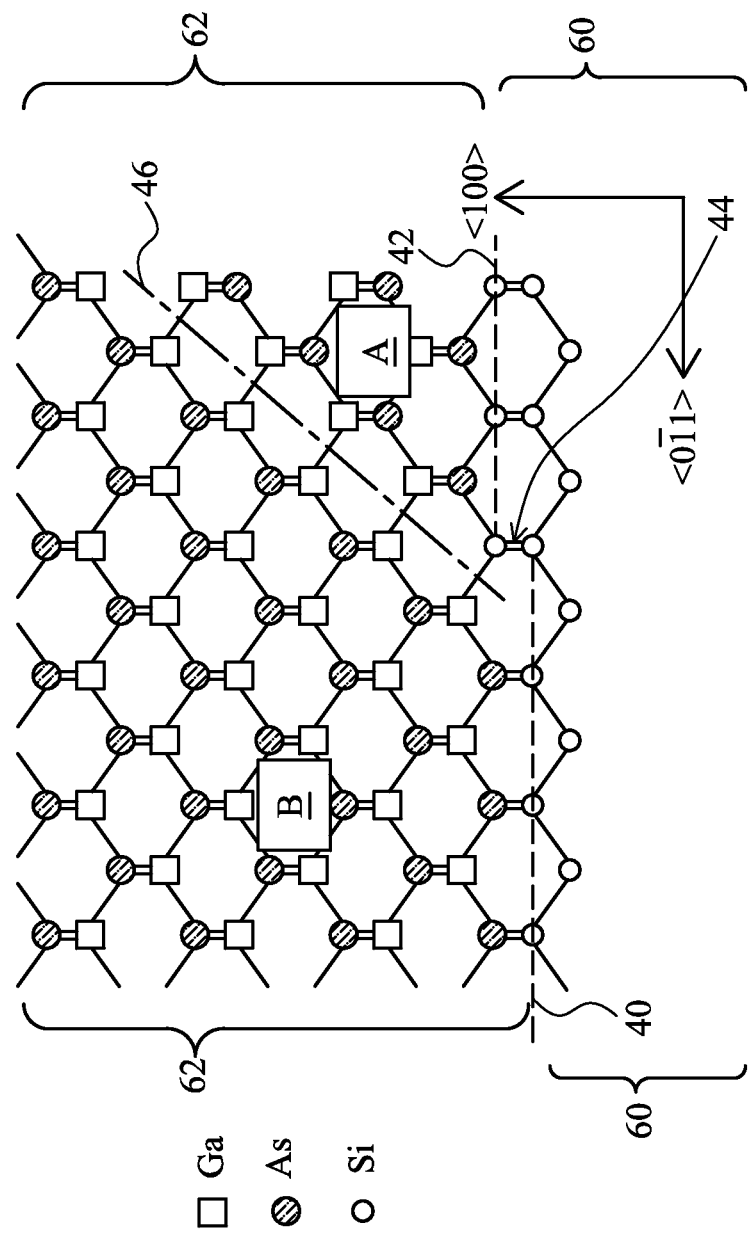
FIG. 6 illustrates the crystal structure of GaAs grown on silicon, wherein anti-phase domain defects are formed due to the single step at the surface of silicon.

FIG. 6 illustrates a crystalline structure including III-V compound semiconductor region 62 grown from the underlying silicon region 60. The illustrated exemplary semiconductor region 62 comprises GaAs. The gallium atom, arsenic atoms, and silicon atoms are marked using legend. It is shown that the surface of silicon region 60 includes levels 40 and 42. The transition from level 40 to level 42 forms a single step 44. Hence, the illustrated surface of silicon is a single-step surface. As a result, the GaAs crystal 62 formed thereon includes two domains A and B, with the domain boundary being schematically illustrated using line 46. Hence, an anti-phase domain defect is formed at domain boundary 46.

Figure 7:
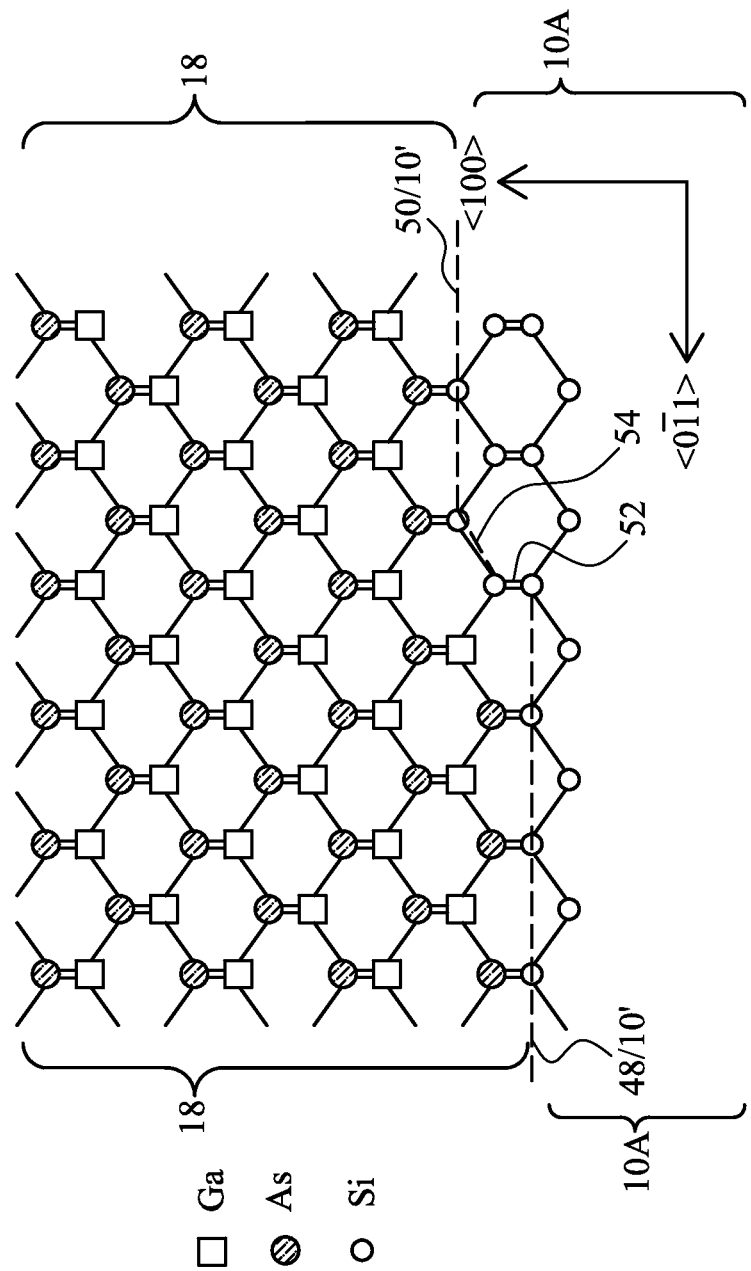
FIG. 7 illustrates the crystal structure of GaAs grown on silicon, wherein anti-phase domain defects are not formed due to the double step at the surface of silicon.

By using the embodiments of the present disclosure, however, a double-step silicon surface may be formed, and anti-phase domain defects will not occur. FIG. 7 illustrates a crystalline structure including semiconductor region 18 grown from top surface 10' of substrate portion 10A (also shown in FIG. 5). The illustrated exemplary semiconductor region 18 also comprises GaAs, with the gallium atom, arsenic atoms, and silicon atoms marked using a legend. It is shown that top surface 10' of silicon region 10A includes two levels 48 and 50. The transition from level 48 to level 50 includes two steps 52 and 54. Hence, the illustrated surface 10' is a double-step surface. As a result, a perfect GaAs crystal is grown from the double-step surface 10', with no separate domains formed, and no anti-phase domain defect formed.

By adopting the anneal using a process gas comprising hydrogen and HCl, the silicon surfaces in the trenches may form double steps, and the single steps at the surface of silicon may be converted to double steps. The compound semiconductor formed from the double-step surface may thus be substantially free from anti-phase domain defects. The annealing process may be performed at a low temperature, for example, between about 700° C. and about 725° C. In this temperature range, and with the help of HCl, the single-step surfaces of silicon may reliably be converted to double-step surfaces, with no risk of incurring warpage on wafer 100 at all. Advantageously, when annealed at this temperature range, no warpage will occur to the silicon wafers that include STI regions formed therein. Conventional knowledge, however, was that in order to form double-step surfaces, the annealing temperature that was needed to convert single-step surfaces to double-step surfaces was higher than 900° C. At this high temperature range, warpage will occur to the wafers due to the effect of STI regions formed therein, and the respective warped wafers faces process difficulties in the subsequent semiconductor processes.

In accordance with some embodiments, a method includes annealing a silicon region in an environment including hydrogen ($H_2$) and hydrogen chloride (HCl) as process gases. After the step of annealing, a semiconductor region is grown from a surface of the silicon region.

In accordance with other embodiments, a method includes annealing a wafer including a silicon region at a temperature lower than about 870° C. Before the step of annealing, the silicon region has a surface having single steps. The single steps are converted to double steps by the step of annealing. After the step of annealing, a compound semiconductor region is grown from the surface of the silicon region.

In accordance with yet other embodiments, a method includes forming STI regions in a silicon substrate, and recessing a portion of the silicon substrate between two portions of the STI regions to form a recess. After the step of recessing, annealing the silicon substrate in an environment comprising hydrogen and hydrogen chloride as process gases, wherein the annealing is performed at a temperature lower than about 870° C. After the step of annealing, a compound semiconductor region is grown from a surface of the silicon substrate, wherein the surface of the silicon substrate is in the recess. The method further includes recessing the STI regions, wherein a portion of the compound semiconductor region over top surfaces of remaining portions of the STI regions forms a semiconductor fin. A gate dielectric is formed on sidewalls and a top surface of the semiconductor fin. A gate electrode is formed over the gate dielectric. The gate dielectric and the gate electrode form portions of a FinFET.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
    annealing a silicon region in an environment comprising hydrogen ($H_2$) and hydrogen chloride (HCl) as process gases, wherein after annealing the silicon region comprises a multi-step surface;
    forming Shallow Trench Isolation (STI) regions in a silicon substrate;
    recessing a portion of the silicon substrate between two portions of the STI regions to form a recess, wherein the surface of the silicon region is exposed to the recess, and wherein the semiconductor region is grown from the recess; and
    after the step of annealing, growing a semiconductor region from a surface of the silicon region.

2. The method of claim 1, wherein the annealing is performed at a temperature between about 700° C. and about 725° C., and wherein the multi-step surface comprises a double step surface.

3. The method of claim 1, wherein the annealing is performed for a period of time between about 1 minute and about 10 minutes.

4. The method of claim 1 further comprising:
    recessing the STI regions, wherein a portion of the semiconductor region over top surfaces of remaining portions of the STI regions forms a semiconductor fin;
    forming a gate dielectric on sidewalls and a top surface of the semiconductor fin; and
    forming a gate electrode over the gate dielectric, wherein the gate dielectric and the gate electrode form portions of a Fin Field-Effect Transistor (FinFET).

5. The method of claim 1, wherein during the annealing, a flow rate of the HCl is between about 5 sccm and about 200 sccm.

6. The method of claim 1, wherein during the annealing, a flow rate of the $H_2$ is between about 500 sccm and about 20,000 sccm.

7. A method comprising:
    annealing a wafer comprising a silicon region at a temperature lower than 800° C., wherein before the step of annealing, the silicon region comprises a surface comprising single steps, and wherein the single steps are converted to double steps by the step of annealing; and
    after the step of annealing, growing a compound semiconductor region from the surface of the silicon region.

8. The method of claim 7, wherein the annealing is performed in an environment comprising hydrogen ($H_2$) and hydrogen chloride (HCl) as process gases.

9. The method of claim 7, wherein the annealing is performed at a temperature between about 700° C. and about 725° C.

10. The method of claim 7, wherein the annealing is performed for a period of time between about 1 minute and about 10 minutes.

11. The method of claim 7 further comprising:
    before the step of annealing, forming Shallow Trench Isolation (STI) regions in a silicon substrate of the wafer; and
    recessing a portion of the silicon substrate between two of the STI regions to form a recess, wherein the surface of the silicon region is exposed to the recess, and wherein the compound semiconductor region is grown from the recess.

12. The method of claim 7 further comprising:
    recessing the STI regions, wherein a portion of the compound semiconductor region over top surfaces of remaining portions of the STI regions forms a semiconductor fin;
    forming a gate dielectric on sidewalls and a top surface of the semiconductor fin; and
    forming a gate electrode over the gate dielectric, wherein the gate dielectric and the gate electrode form portions of a Fin Field-Effect Transistor (FinFET).

13. The method of claim 7, wherein during the annealing, a first flow rate of the HCl is between about 5 sccm and about 200 sccm, and wherein a second flow rate of the $H_2$ is higher than the first flow rate.

14. A method comprising:
    forming Shallow Trench Isolation (STI) regions in a silicon substrate;

recessing a portion of the silicon substrate between two portions of the STI regions to form a recess;

after the step of recessing, annealing the silicon substrate in an environment comprising hydrogen ($H_2$) and hydrogen chloride (HCl) as process gases, wherein the annealing is performed at a temperature lower than about 870° C.;

after the step of annealing, growing a compound semiconductor region from a surface of the silicon substrate, wherein the surface of the silicon substrate is in the recess and wherein the surface of the silicon substrate comprises a multi-step surface;

recessing the STI regions, wherein a portion of the compound semiconductor region over top surfaces of remaining portions of the STI regions forms a semiconductor fin;

forming a gate dielectric on sidewalls and a top surface of the semiconductor fin; and forming a gate electrode over the gate dielectric, wherein the gate dielectric and the gate electrode form portions of a Fin Field-Effect Transistor (FinFET).

15. The method of claim 14, wherein the annealing is performed at a temperature between about 700° C. and about 725° C.

16. The method of claim 14, wherein the annealing is performed for a period of time between about 1 minute and about 10 minutes.

17. The method of claim 14, wherein during the annealing, a flow rate of the HCl is between about 5 sccm and about 200 sccm.

18. The method of claim 14, wherein during the annealing, a flow rate of the $H_2$ is between about 500 sccm and about 20,000 sccm.

19. The method of claim 14, wherein the step of growing the compound semiconductor region comprises growing a III-V compound semiconductor material.

* * * * *